(12) United States Patent
Seol et al.

(10) Patent No.: US 11,075,189 B2
(45) Date of Patent: Jul. 27, 2021

(54) SEMICONDUCTOR PACKAGE

(71) Applicant: SAMSUNG ELECTRONICS CO., LTD., Suwon-si (KR)

(72) Inventors: Jinkyeong Seol, Suwon-si (KR); Sunchul Kim, Suwon-si (KR); Pyoungwan Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/809,837

(22) Filed: Mar. 5, 2020

(65) Prior Publication Data
US 2021/0082881 A1 Mar. 18, 2021

(30) Foreign Application Priority Data
Sep. 18, 2019 (KR) .................. 10-2019-0114770

(51) Int. Cl.
*H01L 25/065* (2006.01)
*H01L 23/00* (2006.01)
*H01L 23/31* (2006.01)
*H01L 23/16* (2006.01)
*H01L 23/532* (2006.01)

(52) U.S. Cl.
CPC .......... *H01L 25/0657* (2013.01); *H01L 23/16* (2013.01); *H01L 23/31* (2013.01); *H01L 23/53242* (2013.01); *H01L 24/14* (2013.01)

(58) Field of Classification Search
CPC ..... H01L 25/0657; H01L 23/16; H01L 23/31; H01L 23/53242; H01L 24/14
See application file for complete search history.

(56) References Cited

U.S. PATENT DOCUMENTS

| | | |
|---|---|---|
| 6,972,483 B1 | 12/2005 | Song et al. |
| 7,423,341 B2 | 9/2008 | Crispell et al. |
| 8,796,829 B2 | 8/2014 | Lin |
| 9,324,683 B2 | 4/2016 | Min et al. |
| 9,343,535 B2 | 5/2016 | Lee et al. |
| 9,496,199 B2 | 11/2016 | Refai-Ahmed |
| 2008/0042302 A1 | 2/2008 | Crispell et al. |
| 2009/0096115 A1 | 4/2009 | Huang et al. |
| 2013/0099373 A1* | 4/2013 | Kwon ............ H01L 23/36 257/737 |

(Continued)

*Primary Examiner* — Peniel M Gumedzoe
(74) *Attorney, Agent, or Firm* — Lee IP Law, P.C.

(57) ABSTRACT

A semiconductor package including a substrate; a semiconductor stack on the substrate; an underfill between the substrate and the semiconductor stack; an insulating layer conformally covering surfaces of the semiconductor stack and the underfill; a chimney on the semiconductor stack; and a molding member surrounding side surfaces of the chimney, wherein the semiconductor stack has a first upper surface that is a first distance from the substrate and a second upper surface that is a second distance from the substrate, the first distance being greater than the second distance, wherein the chimney includes a thermally conductive filler on the first and second upper surfaces of the semiconductor stack, the thermally conductive filler having a flat upper surface; a thermally conductive spacer on the thermally conductive filler; and a protective layer on the thermally conductive spacer, and wherein an upper surface of the thermally conductive spacer is exposed.

20 Claims, 7 Drawing Sheets

(56) References Cited

U.S. PATENT DOCUMENTS

| | | | |
|---|---|---|---|
| 2014/0340849 A1* | 11/2014 | Kim | H01L 23/36 |
| | | | 361/717 |
| 2015/0054148 A1* | 2/2015 | Jang | H01L 25/105 |
| | | | 257/713 |
| 2015/0108628 A1* | 4/2015 | Yu | H01L 23/36 |
| | | | 257/712 |
| 2015/0130030 A1* | 5/2015 | Ma | H01L 25/0657 |
| | | | 257/621 |
| 2015/0155218 A1* | 6/2015 | Hung | H01L 23/42 |
| | | | 257/690 |

* cited by examiner

SEMICONDUCTOR PACKAGE

CROSS-REFERENCE TO RELATED APPLICATION

Korean Patent Application No. 10-2019-0114770, filed on Sep. 18, 2019, in the Korean Intellectual Property Office, and entitled: "Semiconductor Package," is incorporated by reference herein in its entirety.

BACKGROUND

1. Field

Embodiments relate to a semiconductor package

2. Description of Related Art

In accordance with high integration and high performance of a semiconductor, generation of excessive heat could occur. In order to outwardly dissipate heat generated from a semiconductor chip, a dissipation plate, a heat sink, or the like may be employed.

SUMMARY

The embodiments may be realized by providing a semiconductor package including a substrate; a semiconductor stack mounted on the substrate; an underfill between the substrate and the semiconductor stack; an insulating layer conformally covering surfaces of the semiconductor stack and the underfill; a chimney on the semiconductor stack; and a molding member surrounding side surfaces of the chimney, wherein the semiconductor stack has a first upper surface that is a first distance from the substrate and a second upper surface that is a second distance from the substrate, the first distance being greater than the second distance, wherein the chimney includes a thermally conductive filler on the first upper surface and the second upper surface of the semiconductor stack, the thermally conductive filler having a flat upper surface; a thermally conductive spacer on the flat upper surface of the thermally conductive filler; and a protective layer on the thermally conductive spacer, and wherein an upper surface of the thermally conductive spacer is exposed.

The embodiments may be realized by providing a semiconductor package including a substrate; a semiconductor stack mounted on the substrate; an underfill between the substrate and the semiconductor stack; an insulating layer conformally covering surfaces of the semiconductor stack and the underfill; a chimney on the semiconductor stack; and a molding member surrounding side surfaces of the chimney, wherein the semiconductor stack has a first upper surface that is a first distance from the substrate and a second upper surface that is a second distance from the substrate, the first distance being greater than the second distance, wherein the chimney includes a thermally conductive filler on the first upper surface and the second upper surface of the semiconductor stack, the thermally conductive filler having a flat upper surface, and a thermally conductive spacer on the flat upper surface of the thermally conductive filler, the thermally conductive spacer including a metal material, and wherein an upper surface of the thermally conductive spacer is exposed.

The embodiments may be realized by providing a semiconductor package including a substrate; a lower chip mounted on the substrate; an underfill between the substrate and the lower chip; upper chips stacked in parallel on the lower chip; an insulating layer conformally on an upper surface and side surfaces of the upper chips, an exposed upper surface of the lower chip, and a surface of the underfill; a thermally conductive filler on the upper chips and between the upper chips, the thermally conductive filler having a "T"-shaped cross-section; a thermally conductive spacer on the thermally conductive filler; a protective layer on the thermally conductive spacer; and a molding member surrounding the substrate, the lower chip, the under fill, the upper chips, side surfaces of the thermally conductive filler, side surfaces of the thermally conductive spacer and side surfaces of the protective layer and exposing an upper surface of the protective layer, wherein the thermally conductive spacer includes silicon, and wherein the thermally conductive spacer has a height of 60 to 300 μm.

BRIEF DESCRIPTION OF THE DRAWINGS

Features will be apparent to those of ordinary skill in the art by describing in detail exemplary embodiments with reference to the attached drawings in which.

DETAILED DESCRIPTION

Figure 1:
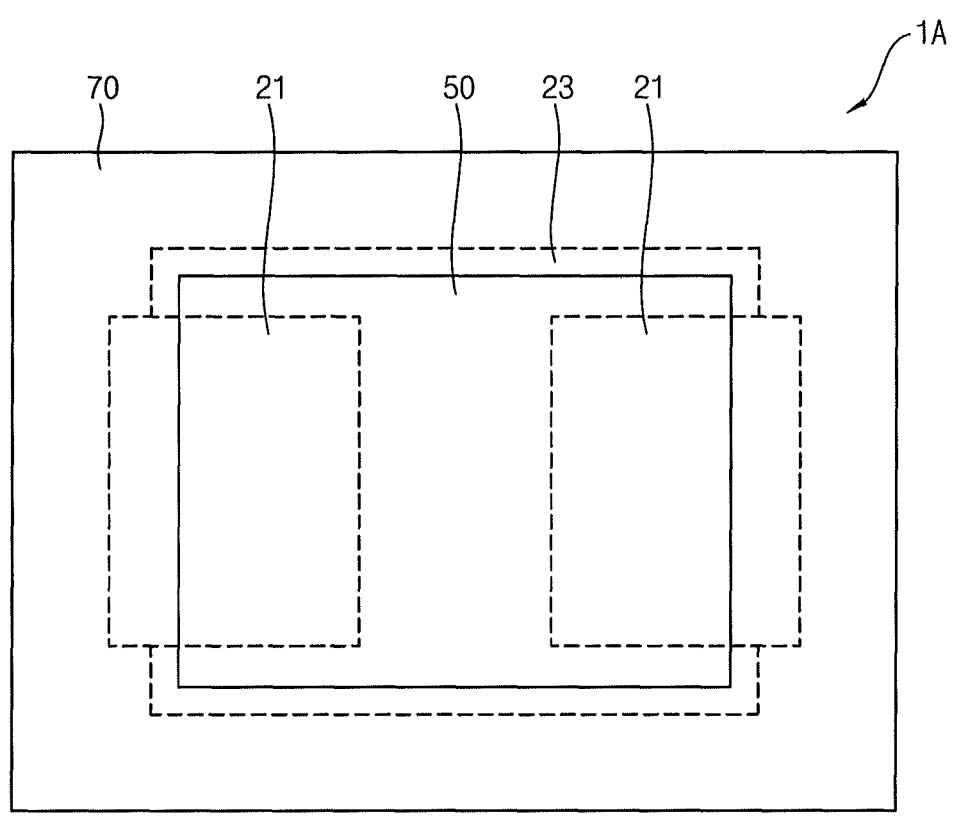
FIG. 1 illustrates a plan view of a semiconductor package according to an embodiment of the present disclosure.

FIG. 1 illustrates a plan view of a semiconductor package 1A according to an embodiment of the present disclosure. FIGS. 2 to 12 illustrate cross-sectional views of the semiconductor package according to various embodiments of the present disclosure, respectively.

Figure 2:
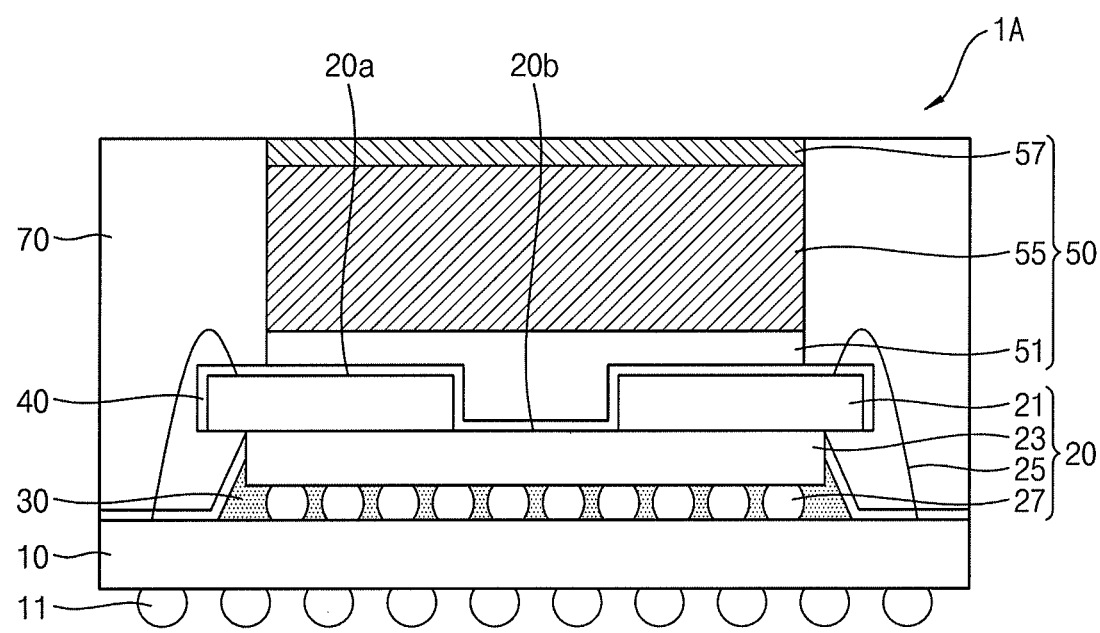
FIGS. 2 to 12 illustrate cross-sectional views of the semiconductor package according to various embodiments of the present disclosure, respectively.

Referring to FIGS. 1 and 2, the semiconductor package 1A according to the illustrated embodiment of the present disclosure may include a substrate 10, a semiconductor stack 20, an underfill 30, an insulating layer 40, a heat dissipator or chimney 50, and a molding member 70.

The semiconductor stack 20, in which semiconductor chips 21 and 23 are stacked, may be mounted on the substrate 10. The substrate 10 may connect the semiconductor chips 21 and 23 to an external circuit, and may help protect the semiconductor chips 21 and 23 from external impact while supporting the semiconductor chips 21 and 23. For example, the substrate 10 may include a printed circuit board (PCB) or a silicon interposer. The substrate 10 may include an upper surface and a lower surface. The upper surface of the substrate 10 is a surface facing the semiconductor stack 20 and on which the semiconductor stack 20 is mounted. The lower surface of the substrate 10 may be defined as a surface opposite to the upper surface. Bumps 11 such as solder balls may be on the lower surface of the substrate 10.

The semiconductor stack 20, which is mounted on the substrate 10, may include a memory chip, a logic chip, or the like. Referring to FIGS. 1 and 2, the semiconductor stack 20 may include a lower chip 23 (having a relatively great horizontal width) and upper chips 21 (arranged in parallel to one another and stacked on the lower chip 23 while having a relatively small horizontal width). The semiconductor stack 20 may further include bumps 27 configured to electrically connect the lower chip 23 to the substrate 10, and wires 25 configured to electrically connect the upper chips 21 to the substrate 10. Referring to FIG. 2, the semiconductor stack may have a first upper surface 20a of a relatively high level (e.g., a relatively larger distance from the substrate 10 in an vertical direction) and a second upper surface 20b of a relatively low level (e.g., a relatively smaller distance from the substrate 10 in the vertical direction). For example, the semiconductor stack 20 may have a non-planar upper surface.

The underfill 30 may be between the substrate 10 and the semiconductor stack 20. The underfill 30 may insulate the bumps 27 at a lower portion of the semiconductor stack 20 from one another. The underfill 30 may also support the semiconductor stack 20 on the substrate 10.

The insulating layer 40 may conformally cover surfaces of the semiconductor stack 20 and the underfill 30. The insulating layer 40 may include epoxy-based resin. The insulating layer 40 may be a thin film and, as such, may be formed through a spray coating process.

The chimney 50 may be configured to disperse excess heat generated from the semiconductor stack 20 (e.g., due to high integration and high performance of the semiconductor stack 20). The chimney 50 may be over the semiconductor stack 20 (e.g., such that the semiconductor stack 20 is between the chimney 50 and the substrate 10 in the vertical direction). Referring to FIGS. 1 and 2, the chimney 50 may cover, e.g., completely cover, portions of the individual semiconductor chips 21 and 23 of the semiconductor stack 20 when viewed at a top side. For example, the chimney 50 may dissipate heat generated by all or each of the individual semiconductor chips 21 and 23 to the outside of the semiconductor package. Referring to FIG. 2, the chimney 50 may include a thermally conductive filler 51, a thermally conductive spacer 55, and a protective layer 57.

The thermally conductive filler 51 may be on the first and second upper surfaces 20a and 20b of the semiconductor stack 20, and may have a flat upper surface. The thermally conductive filler 51 may exhibit flowability before cured, e.g., during coating thereof. For example, as the thermally conductive filler 51 is coated over or on the upper surface of the semiconductor stack 20, the thermally conductive filler 51 may planarize the upper surface of the semiconductor stack 20. Referring to FIG. 2, the thermally conductive filler 51 may be on the upper surfaces of the upper chips 21 stacked in parallel and the upper surface of the lower chip 23 between the upper chips 21. In an implementation, the thermally conductive filler 51 may include, e.g., silver (Ag).

The thermally conductive spacer 55 may be on the thermally conductive filler 51. The thermally conductive spacer 55 may be fabricated to have various heights, as desired or in view of the application. If desired, the overall height of the chimney 50 may be adjusted by way of adjustment of the height of the thermally conductive spacer 55 (e.g., by only adjusting the height of the thermally conductive spacer 55). In an implementation, the thermally conductive spacer 55 may be or include silicon.

In some devices, formation of a chimney may be achieved using a method in which a solution of a material having high thermal conductivity is injected and then cured. In such method, an injection process, in which a solution having a height of 100 µm is coated at one injection time, is executed. When it is desired to secure a specific height, accordingly, it may be necessary to execute the injection process several times. For example, the process time may become excessively long. When the solution is injected using a nozzle having a large diameter in order to reduce the process time, a solution having a height of 300 to 400 µm cold be coated at one injection time. In this case, however, the solution could have difficulty penetrating into narrow and fine areas because the width of the solution increases. For example, cracks or air bubbles could be formed.

When the chimney 50 in the semiconductor package 1A according to the illustrated embodiment of the present disclosure is configured to include the thermally conductive filler 51 and the thermally conductive spacer 55, which are made of different materials, e.g., the chimney 50 is made of different materials, it may be possible not only to reduce a process time, but also to easily vary the total height of the chimney 50, by planarizing the layer on the non-planar upper surface of the semiconductor stack 20 through coating the thermally conductive filler 51, and then attaching, to the (flat-topped) thermally conductive filler 51, the thermally conductive spacer 55, which may be previously fabricated to have various heights.

Referring to FIG. 2, it may be possible to dispose or attach the thermally conductive spacer 55 on the thermally conductive filler 51 by pressing the thermally conductive spacer 55 against the upper surface of the thermally conductive filler 51 under a condition in which the thermally conductive filler 51 is not yet cured, and then curing the thermally conductive filler 51.

The protective layer 57 may protect the thermally conductive spacer 55 in a procedure of exposing the chimney 50 through a grinding process after an epoxy molding process for the semiconductor package 1A. For example, the protective layer 57 may be on the thermally conductive spacer 55. Referring to FIGS. 1 and 2, the protective layer 57 may be exposed at an upper surface of the semiconductor package. The protective layer 57 may include a filler. The protective layer 57 may include a metal material, e.g., aluminum (Al) or silver (Ag). In an implementation, the protective layer 57 may include, e.g., an alumina (aluminum oxide ($Al_2O_3$)) filler. In an implementation, the protective layer 57 may further include, e.g., a silicon (Si) material. The protective layer 57 may have higher hardness than the thermally conductive spacer 55 in order to protect the thermally conductive spacer 55 during the grinding process.

The molding member 70 may protect the semiconductor chips 21 and 23 and the chimney 50 from a surrounding environment. The molding member 70 may be a housing formed through a molding process. The molding member 70 may include an epoxy molding compound (EMC).

Figure 3:
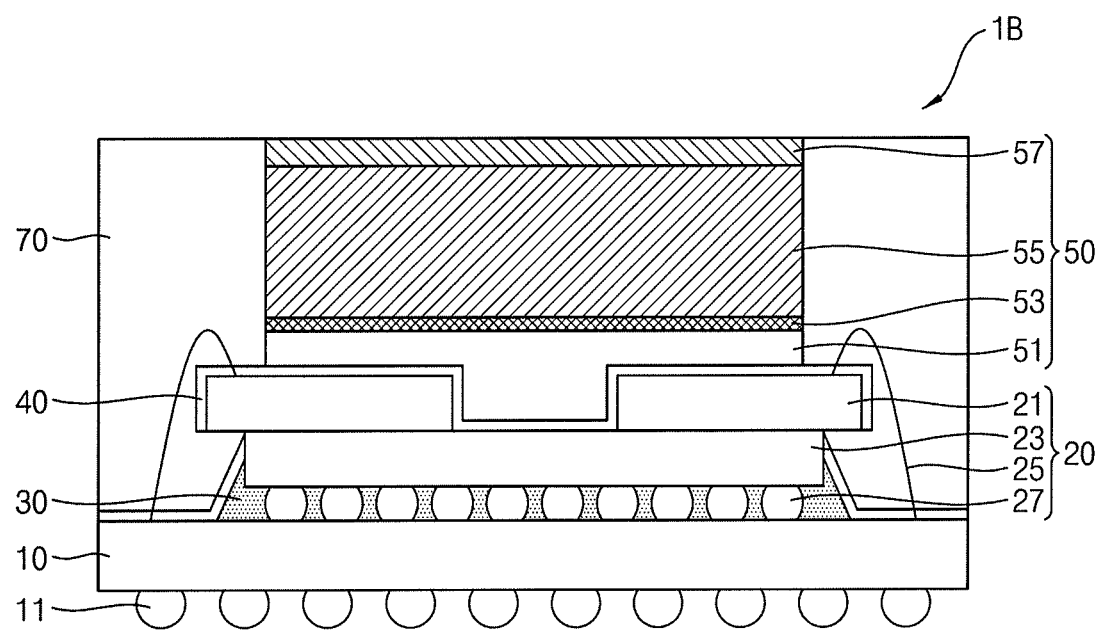

Referring to FIG. 3, in the semiconductor package 1B, the chimney 50 may further include an adhesive layer 53 between the thermally conductive filler 51 and the thermally conductive spacer 55. For example, the thermally conductive filler 51 may be cured, the adhesive layer 53 may be disposed on the cured thermally conductive filler 51, and then the thermally conductive spacer 55 may be disposed on the adhesive layer 53.

Figure 4:
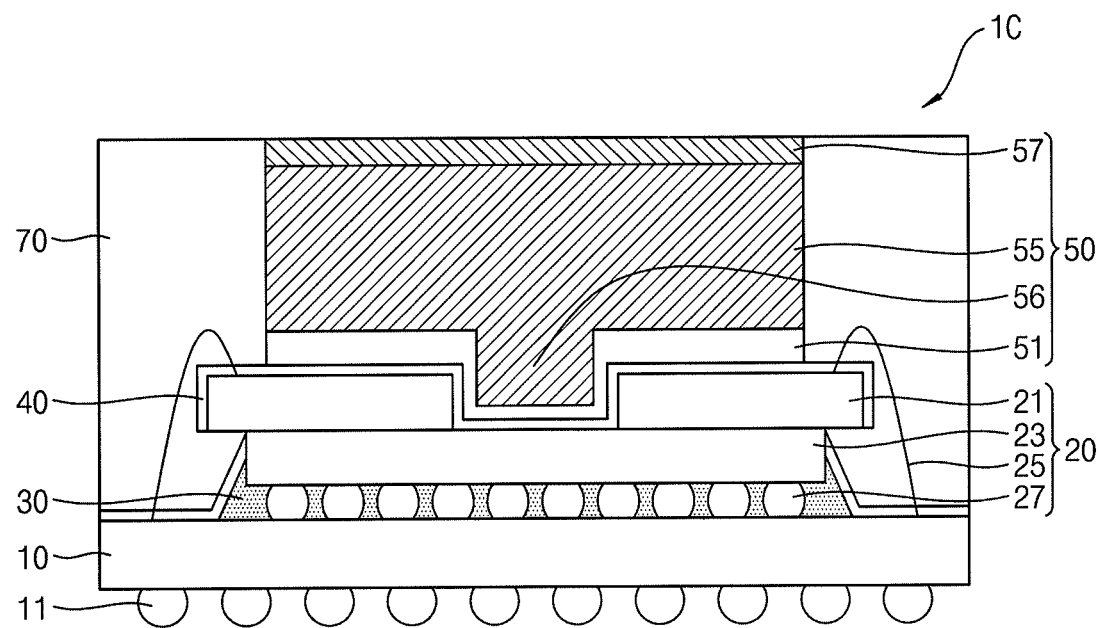

Referring to FIG. 4, in the semiconductor package 1C, the thermally conductive spacer 55 may include a protrusion 56 protruding downwardly (e.g., toward the substrate 10 in the vertical direction) between the upper chips 21. When the thermally conductive spacer 55 includes the protrusion 56, it is unnecessary to completely fill a space between the upper chips 21 by the thermally conductive filler 51. For example, it may be possible to reduce the amount of the thermally conductive filler 51 used and to reduce the process time.

Figure 5:
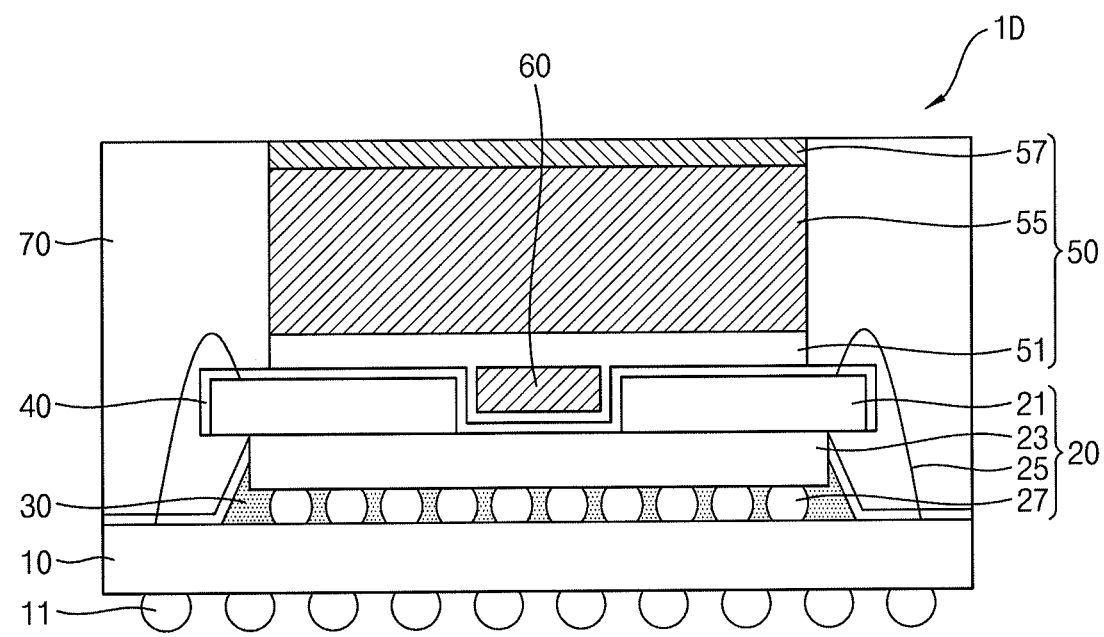

Referring to FIG. 5, the semiconductor package 1D according to the illustrated embodiment of the present disclosure may further include a stack layer spacer 60 between the upper chips 21. The stack layer spacer 60 may include the same material as the thermally conductive spacer 55. The insulating layer 40 on the upper chips 21 and the stack layer spacer 60 may have substantially coplanar surfaces, respectively. The stack layer spacer 60 may be made of a conductive material and, as such, the insulating layer 40 may also be between the upper surface of the lower chip 23 and the stack layer spacer 60. The thermally conductive filler 51 may also be between the insulating layer 40 and the stack layer spacer 60 and, as such, may surround the upper, lower, and side surfaces of the stack layer spacer 60.

Figure 6:
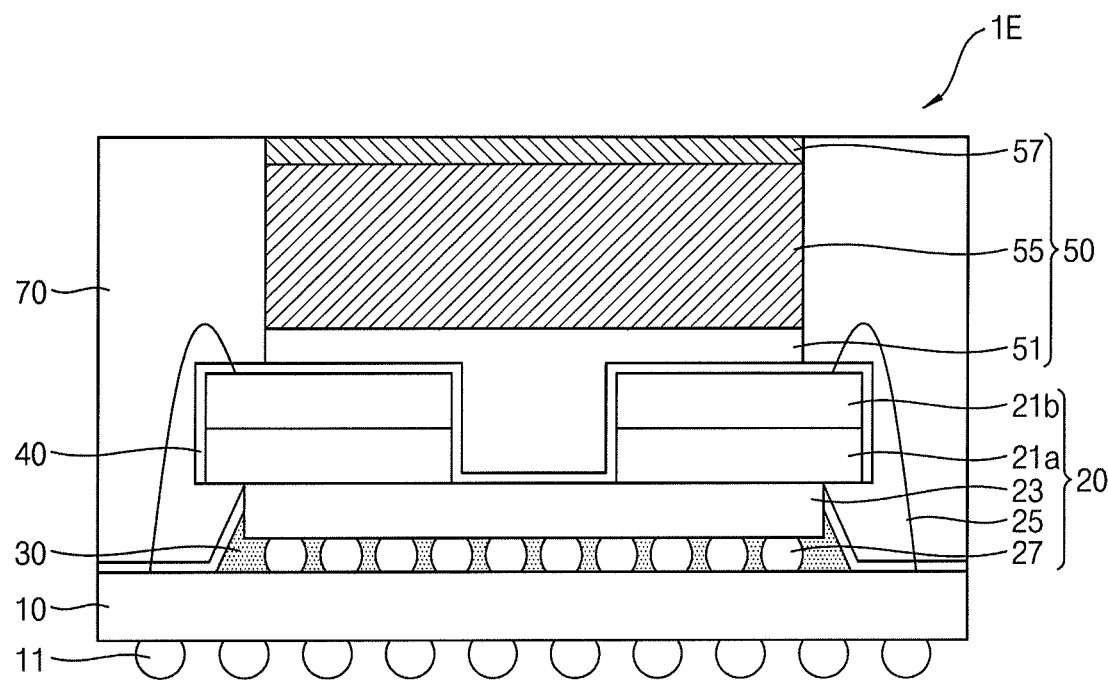

Referring to FIG. 6, in the semiconductor package 1E, the upper chips of the semiconductor stacks 20 may include a first-layer upper chip 21a stacked on the lower chip 23 and a second-layer upper chip 21b stacked on the first-layer upper chip 21a (e.g., such that the first-layer upper chip 21a is between the second-layer upper chip 21b and the substrate 10 in the vertical direction).

Figure 7:
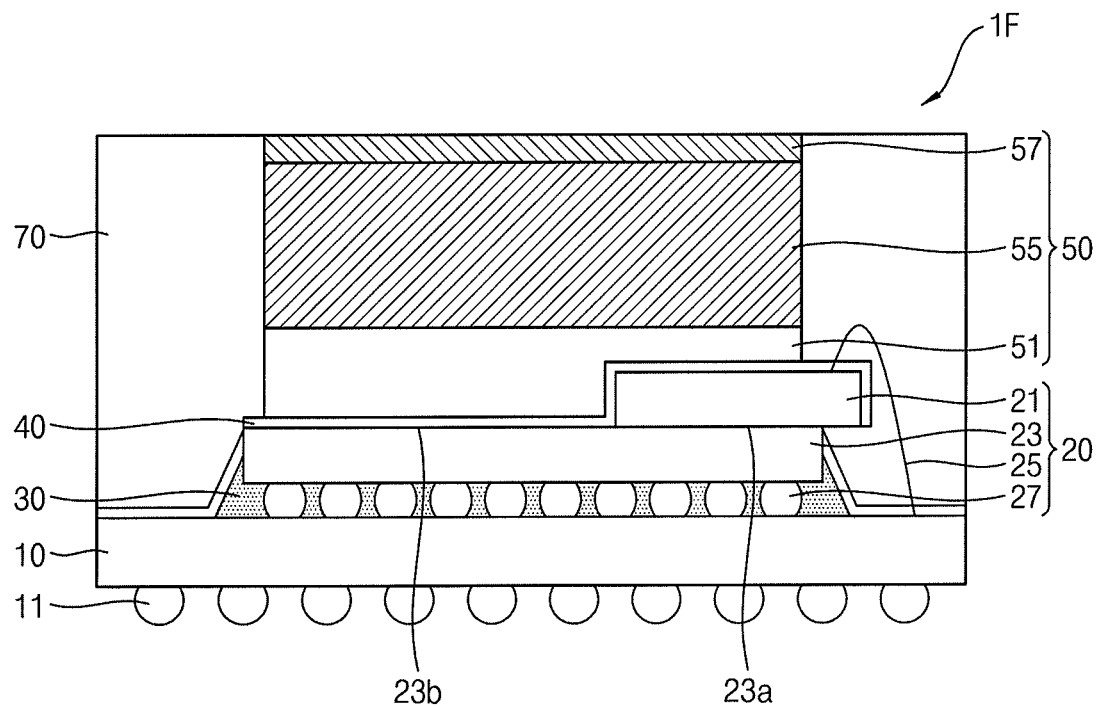

Referring to FIG. 7, in the semiconductor package 1F, the semiconductor stack 20 may include a lower chip 23 having a relatively great horizontal width, an upper chip 21 stacked on the lower chip 23 and having a relatively small horizontal width, bumps 27 configured to electrically connect the lower chip 23 and the substrate 20, and wires 25 configured to electrically connect the upper chip 21 and the substrate 10. The lower chip 23 may include a first upper surface 23a, on which the upper chip 21 is disposed, and a second upper surface 23b (e.g., laterally adjacent to the first upper surface 23a), on which the upper chip 21 is not disposed.

Figure 8:
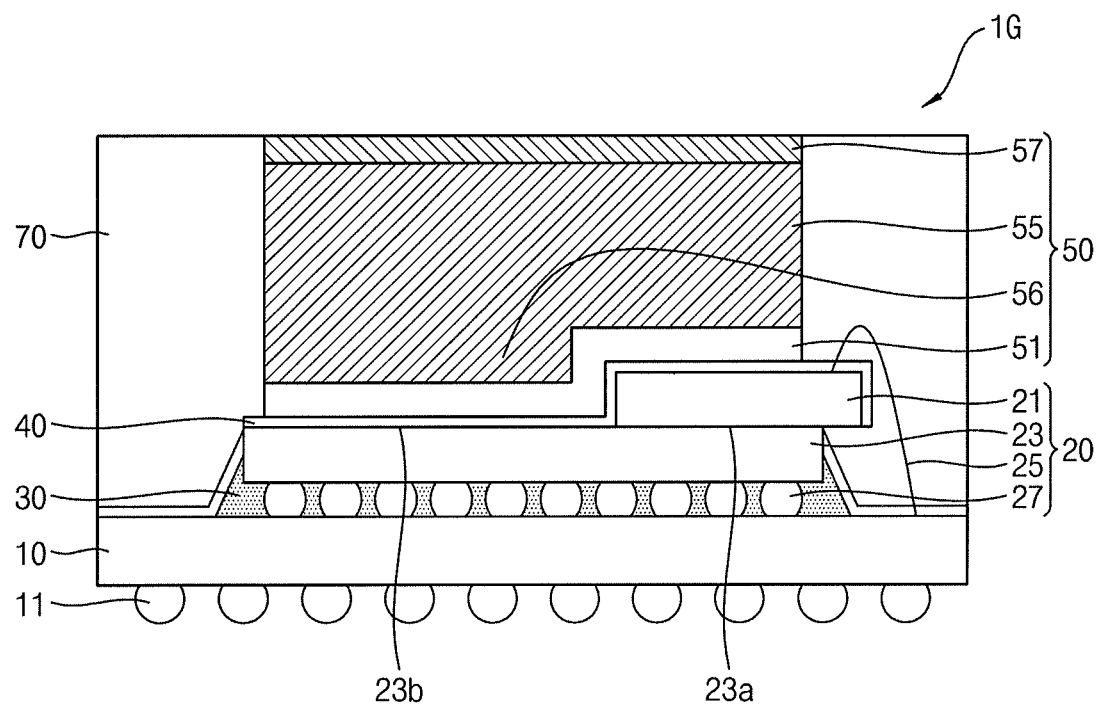

Referring to FIG. 8, in the semiconductor package 1G, the thermally conductive spacer 55 may include a protrusion 56 protruding downwardly toward the second upper surface 23b of the lower chip 23. When the thermally conductive spacer 55 includes the protrusion 56, it may be unnecessary to completely fill a space between the second upper surface 23b of the lower chip 23 and the upper surface of the upper chip 21. For example, it may be possible to reduce the amount of the thermally conductive filler 51 used and to reduce the process time.

Figure 9:
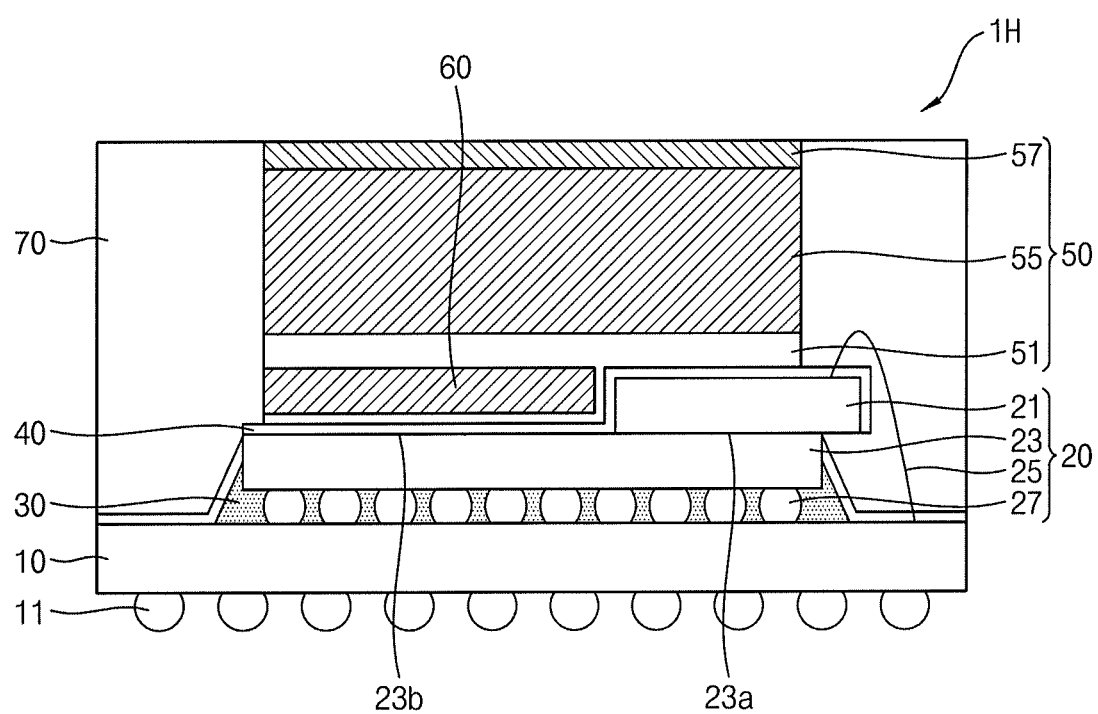

Referring to FIG. 9, the semiconductor package 1H according to the illustrated embodiment of the present disclosure may further include a stack layer spacer 60 between the second upper surface 23b of the lower chip 23 and the lower surface of the thermally conductive spacer 55. The stack layer spacer 60 may include the same material as the thermally conductive spacer 55. The stack layer spacer 60 may have a substantially coplanar surface with the insulating layer 40 on the upper chip 21. The thermally conductive filler 51 may cover the upper surface of the stack layer spacer 60. The insulating layer 40 may also be between the second upper surface 23b of the lower chip 23 and the stack layer spacer 60.

Figure 10:
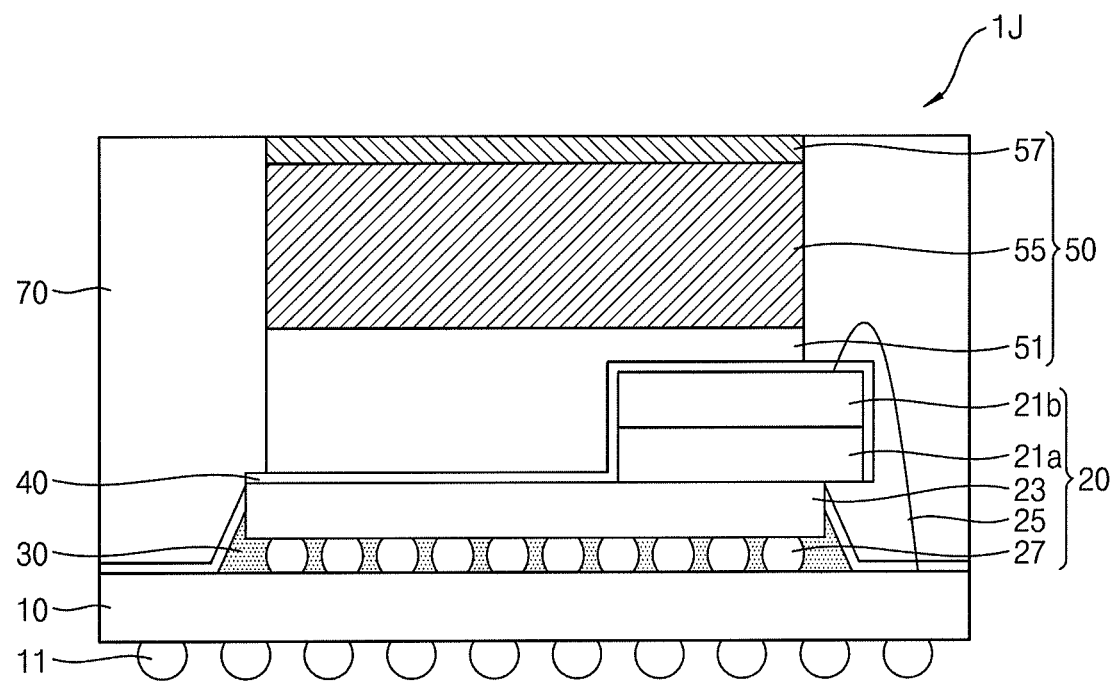

Referring to FIG. 10, in the semiconductor package 1J, the upper chips of the semiconductor stack 20 may include a first-layer upper chip 21a stacked on the lower chip 23 and a second-layer upper chip 21b stacked on the first-layer upper chip 21a.

Figure 11:
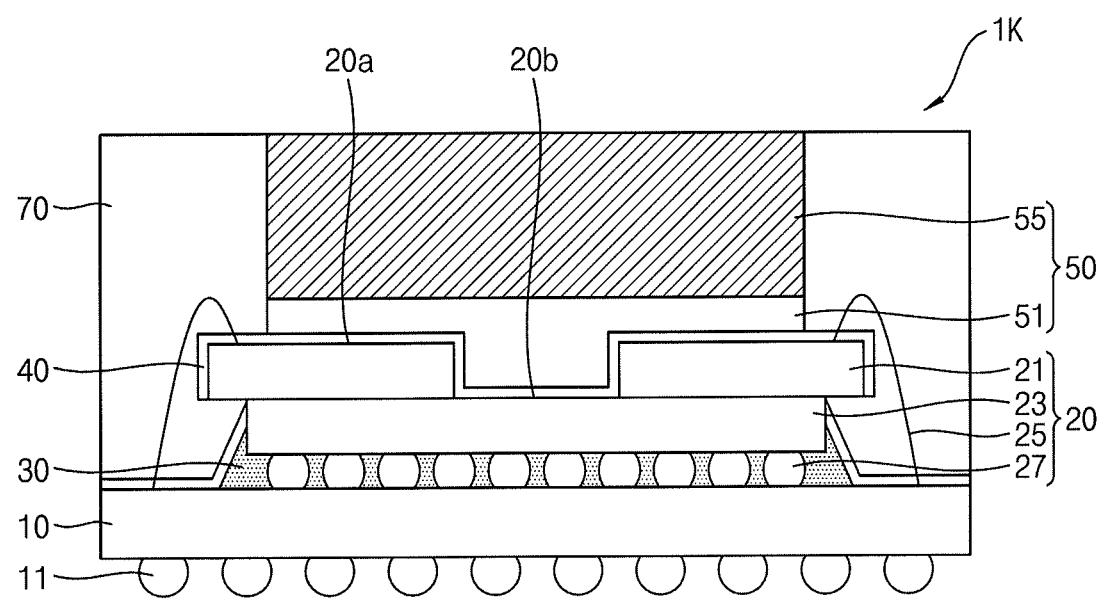

Referring to FIG. 11, the semiconductor package 1K according to the illustrated embodiment of the present disclosure may include a substrate 10, a semiconductor stack 20, an underfill 30, an insulating layer 40, a chimney 50, and a molding member 70. The semiconductor stack 20 may have a first upper surface 20a of a relatively high level and a second upper surface 20b of a relatively low level. The semiconductor stack 20 may be mounted on the substrate 10. The underfill 30 may be between the substrate 10 and the semiconductor stack 20. The insulating layer 40 may conformally cover surfaces of the semiconductor stack 20 and the underfill 30. The chimney 50 may be over or on the semiconductor stack 20. The molding member 70 may surround side surfaces of the chimney 50. The chimney 50 may include a thermally conductive filler 51 at or on the first and second upper surfaces 20a and 20b of the semiconductor stack 20 (while having a flat upper surface), and a thermally conductive spacer 55 on the thermally conductive filler 51 (while being made of, e.g., a metal material). The thermally conductive spacer 55 may be exposed outwardly from or at the molding member 70 at an upper surface of the semiconductor package 1K. For example, the chimney 50 may not include the protective layer 57. In an implementation, the chimney 50 may further include an adhesive layer 53 between the thermally conductive filler 51 and the thermally conductive spacer 55.

Figure 12:
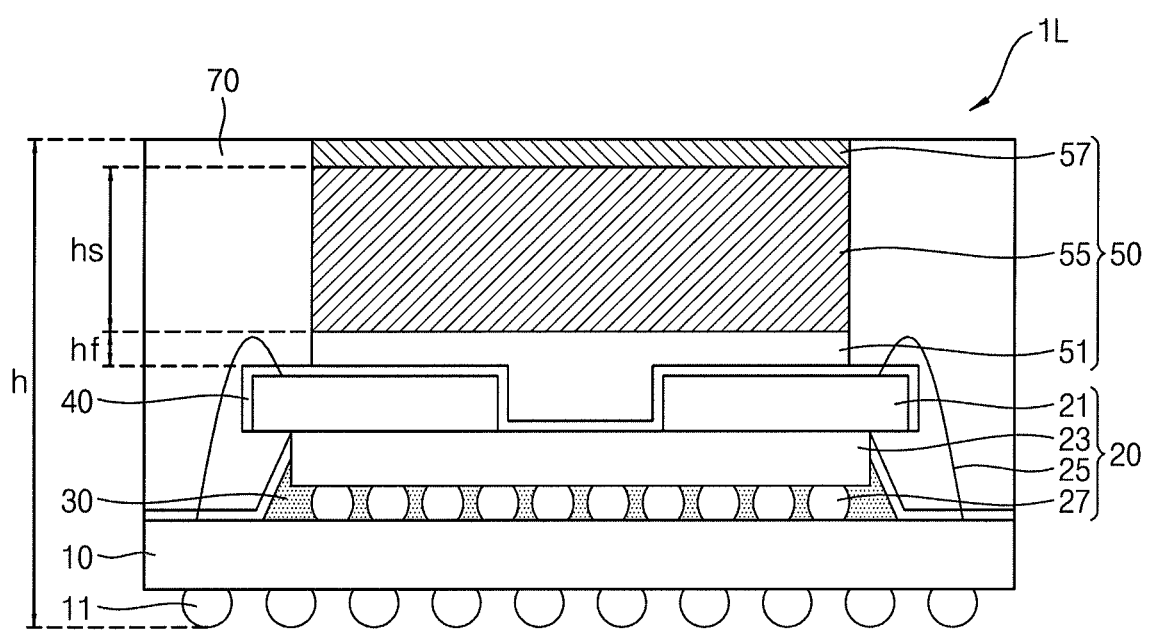

Referring to FIG. 12, the semiconductor package 1L according to the illustrated embodiment of the present disclosure may include a substrate 10, a lower chip 23 mounted on the substrate 10, an underfill 30 between the substrate 10 and the lower chip 23, upper chips 21 stacked in parallel on the lower chip 23, an insulating layer 40 conformally on upper and side surfaces of the upper chips 21, an exposed upper surface of the lower chip 23, and a surface of the underfill 30, a thermally conductive filler 51 on the upper chips 21 and between the upper chips 21 while having a "T"-shaped cross-section, a thermally conductive spacer 55 on the thermally conductive filler 51, a protective layer 57 on the thermally conductive spacer 55, and a molding member 70 surrounding the substrate 10, the lower chip 23, the underfill 30, the upper chips 21, side surfaces of the thermally conductive filler 51, side surfaces of the thermally conductive spacer 55 and side surfaces of the protective layer 57 while exposing an upper surface of the protective layer 57. The molding member 70 may have a vertical height of 200 to 500 μm. The thermally conductive spacer 55 may include silicon. The thermally conductive spacer 55 may have a height (hs) of 60 to 300 μm. The thermally conductive filler 51 may have a height hf of about 100 μm from the upper surface of each upper chip 21. In an implementation, the semiconductor package 1L may further include a stack layer spacer between the upper chips 21. The insulating layer 40 on the upper chips 21 and the stack layer spacer may have substantially coplanar surfaces, respectively.

By way of summation and review, in order to reduce influence of excessive heat generated by a semiconductor chip on elements around the semiconductor chip (due to high integration of the semiconductor), a height of a thermal path (along which heat generated at the semiconductor chip is outwardly dissipated) may be adjusted.

In addition, to address diversification of functions of a semiconductor, a system-in-package (SiP) structure, in which semiconductor chips of various types are stacked, in place of semiconductor chips of a single type, has been developed. In such a SiP structure, a semiconductor stack having various shapes may be mounted in a package. Such a semiconductor stack, which may include various kinds of stacked semiconductor chips, may have a non-planar or uneven upper surface. For example, a semiconductor package structure may be capable of effectively dissipating heat of a semiconductor stack having a non-planar upper surface.

As apparent from the above description, in the semiconductor package according to the illustrated embodiment of the present disclosure, it may be possible to planarize the non-planar upper surface of the semiconductor stack by coating a thermally conductive filler exhibiting flowability before curing. In the semiconductor package according to the illustrated embodiment, a thermally conductive spacer, which is previously fabricated, may be disposed over the thermally conductive filler. For example, in the semiconductor package according to the illustrated embodiment, it may be possible to effectively dissipate heat of the semiconductor stack having the non-planar upper surface. In addition, the previously-fabricated thermally conductive spacer may have various heights and, as such, the height of the chimney may be adjusted.

One or more embodiments may provide a semiconductor package including a chimney formed of different materials, which is capable of not only effectively dissipating heat of a semiconductor stack having a non-planar surface, but also adjusting a height of the chimney, if desired.

One or more embodiments may provide a semiconductor package capable of not only effectively dissipating heat of a semiconductor stack having a non-planar upper surface through inclusion of a thermally conductive filler material exhibiting flowability before curing, but also adjusting a height of a chimney, if desired, through inclusion of a previously-prepared thermally conductive spacer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A semiconductor package, comprising:
a substrate;
a semiconductor stack mounted on the substrate;
an underfill between the substrate and the semiconductor stack;
an insulating layer conformally covering surfaces of the semiconductor stack and the underfill;
a chimney on the semiconductor stack; and
a molding member surrounding side surfaces of the chimney,
wherein the semiconductor stack has a first upper surface that is a first distance from the substrate and a second upper surface that is a second distance from the substrate, the first distance being greater than the second distance,
wherein the chimney includes:
a thermally conductive filler on the first upper surface and the second upper surface of the semiconductor stack, the thermally conductive filler having a flat upper surface;
a thermally conductive spacer on the flat upper surface of the thermally conductive filler; and
a protective layer on the thermally conductive spacer, and
wherein an upper surface of the protective layer is exposed.

2. The semiconductor package as claimed in claim 1, wherein the thermally conductive spacer includes silicon.

3. The semiconductor package as claimed in claim 1, wherein the thermally conductive filler includes silver.

4. The semiconductor package as claimed in claim 1, wherein:
the protective layer includes aluminum or silver; and
the protective layer has a higher hardness than the thermally conductive spacer.

5. The semiconductor package as claimed in claim 1, wherein the chimney further includes an adhesive layer between the thermally conductive filler and the thermally conductive spacer.

6. The semiconductor package as claimed in claim 1, wherein the semiconductor stack includes:
a lower chip having a first horizontal width;
upper chips parallel to one another and stacked on the lower chip, the upper chips each having a second horizontal width that is less than the first horizontal width;
bumps configured to electrically connect the lower chip to the substrate; and
wires configured to electrically connect the upper chips to the substrate.

7. The semiconductor package as claimed in claim 6, wherein the thermally conductive spacer includes a protrusion protruding toward the second upper surface of the semiconductor stack between the upper chips.

8. The semiconductor package as claimed in claim 6, wherein the thermally conductive filler is on upper surfaces of the upper chips and between the upper chips.

9. The semiconductor package as claimed in claim 8, further comprising: a stack layer spacer between the upper chips.

10. The semiconductor package as claimed in claim 9, wherein:
the insulating layer on the upper chips and the stack layer spacer have substantially coplanar surfaces;
the insulating layer is also between an upper surface of the lower chip and the stack layer spacer; and
the thermally conductive filler is also between the insulating layer and the stack layer spacer such that the thermally conductive filler surrounds upper, lower, and side surfaces of the stack layer spacer.

11. The semiconductor package as claimed in claim 6, wherein the upper chip includes:
a first-layer upper chip, and
a second-layer upper chip stacked on the first-layer upper chip.

12. The semiconductor package as claimed in claim 1, wherein:
the semiconductor stack includes
a lower chip having a first horizontal width,
an upper chip stacked on the lower chip, the upper chip having a second horizontal width that is less than the first horizontal width,
bumps configured to electrically connect the lower chip and the substrate, and
wires configured to electrically connect the upper chip and the substrate; and
the lower chip includes a first upper surface, on which the upper chip is disposed, and a second upper surface, on which the upper chip is not disposed.

13. The semiconductor package as claimed in claim 12, wherein the thermally conductive spacer includes a protrusion protruding downwardly toward the second upper surface of the lower chip.

14. The semiconductor package as claimed in claim 12, further comprising a stack layer spacer between the second upper surface of the lower chip and a lower surface of the thermally conductive spacer.

15. The semiconductor package as claimed in claim 14, wherein:

the stack layer spacer has a substantially coplanar surface with the insulating layer on the upper chip;

the thermally conductive filler covers an upper surface of the stack layer spacer; and the insulating layer is also between the second upper surface of the lower chip and the stack layer spacer.

16. The semiconductor package as claimed in claim 12, wherein the upper chip includes a first-layer upper chip and a second-layer upper chip stacked on the first-layer upper chip.

17. A semiconductor package, comprising:

a substrate;

a semiconductor stack mounted on the substrate;

an underfill between the substrate and the semiconductor stack;

an insulating layer conformally covering surfaces of the semiconductor stack and the underfill;

a chimney on the semiconductor stack; and a molding member surrounding side surfaces of the chimney, wherein the semiconductor stack has a first upper surface that is a first distance from the substrate and a second upper surface that is a second distance from the substrate, the first distance being greater than the second distance, wherein the chimney includes:

a thermally conductive filler on the first upper surface and the second upper surface of the semiconductor stack, the thermally conductive filler having a flat upper surface, and a thermally conductive spacer on the flat upper surface of the thermally conductive filler, the thermally conductive spacer including a metal material, and wherein an upper surface of the thermally conductive spacer is exposed.

18. The semiconductor package as claimed in claim 17, wherein the chimney further includes an adhesive layer between the thermally conductive filler and the thermally conductive spacer.

19. A semiconductor package, comprising:

a substrate;

a lower chip mounted on the substrate;

an underfill between the substrate and the lower chip;

upper chips stacked in parallel on the lower chip;

an insulating layer conformally on an upper surface and side surfaces of the upper chips, an exposed upper surface of the lower chip, and a surface of the underfill;

a thermally conductive filler on the upper chips and between the upper chips, the thermally conductive filler having a "T"-shaped cross-section;

a thermally conductive spacer on the thermally conductive filler;

a protective layer on the thermally conductive spacer; and a molding member surrounding the substrate, the lower chip, the under fill, the upper chips, side surfaces of the thermally conductive filler, side surfaces of the thermally conductive spacer and side surfaces of the protective layer and exposing an upper surface of the protective layer, wherein the thermally conductive spacer includes silicon, and wherein the thermally conductive spacer has a height of 60 to 300 μm.

20. The semiconductor package as claimed in claim 19, further comprising a stack layer spacer between the upper chips, wherein the upper surfaces of the upper chips and an upper surface of the stack layer spacer are substantially coplanar.

* * * * *